United States Patent [19]

Torburn

[11] 4,089,042
[45] May 9, 1978

[54] SUPPORT FOR HYBRID SUBSTRATE CARRYING ELECTRICAL CIRCUIT PATTERNS AND ELEMENTS

[75] Inventor: Roy B. Torburn, Palo Alto, Calif.

[73] Assignee: GTE Automatic Electric Laboratories Incorporated, Northlake, Ill.

[21] Appl. No.: 744,208

[22] Filed: Nov. 22, 1976

[51] Int. Cl.² ............................................. H05K 1/04
[52] U.S. Cl. ..................................... 361/412; 361/399
[58] Field of Search ............... 361/403, 412, 413, 418, 361/399; 339/17 LM, 17 M

[56] References Cited

U.S. PATENT DOCUMENTS

| 3,522,485 | 8/1970 | De Metric | 361/399 |
| 3,652,899 | 3/1972 | Henschen | 361/412 |

Primary Examiner—David Smith, Jr.
Attorney, Agent, or Firm—Russell A. Cannon; Leonard R. Cool

[57] ABSTRACT

A substrate carrying electrical circuit patterns and elements is supported in an upright position on a printed circuit board by a clip so as to restrict rotational movement of the substrate from that position when pins and plated through holes on the substrate and board are engaged. The clip comprises a body having a flat bottom for contacting one side of the board and a first-cylindrical peg depending from the bottom. Spaced-apart sections on one side of the body are in a common plane perpendicular to the bottom with a protrusion near the top of the body extending beyond this plane. A second-rectangular peg also extends from the one side of the body past the common plane, with the base of the second peg being in line with the flat bottom. A trough in the protrusion receives one edge of the substrate, with one side of the latter contacting the side sections in the common plane, and the opposing edge of the substrate being proximate the bottom of the body. When the pins are engaged in the plated through holes, the first peg makes a slip fit in a hole in the board to restrict rotational movement of the substrate.

5 Claims, 5 Drawing Figures

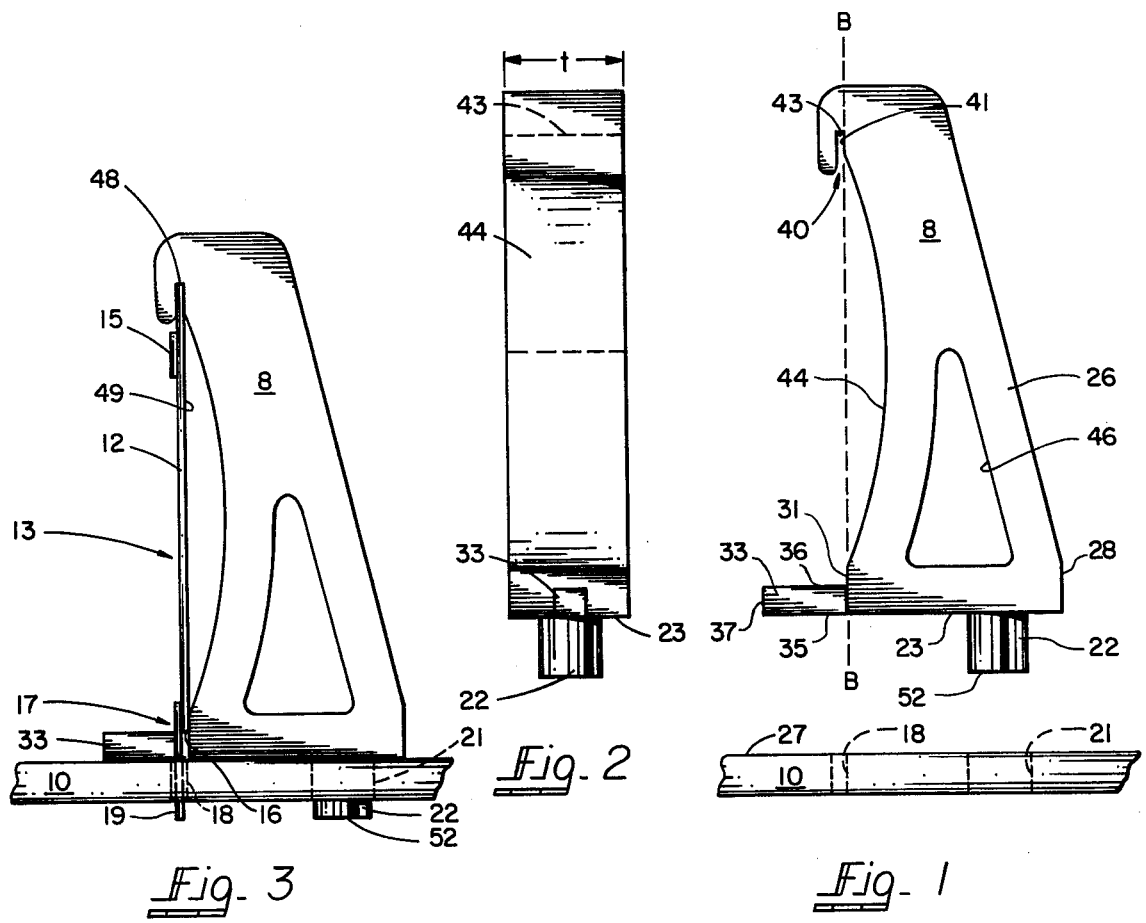
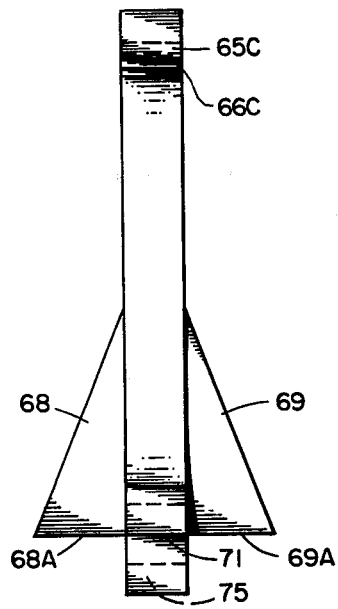
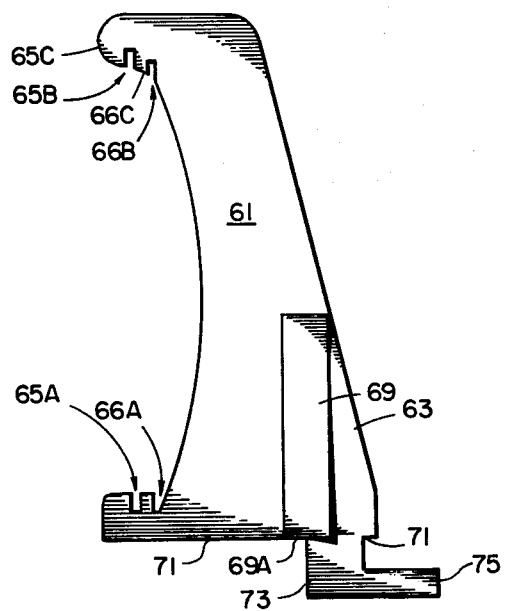

SUPPORT FOR HYBRID SUBSTRATE CARRYING ELECTRICAL CIRCUIT PATTERNS AND ELEMENTS

BACKGROUND OF INVENTION

This invention relates to support structures for electrical components, and more particularly to structures supporting the substrate of microelectronic hybrid circuits.

Complex electronic equipment generally includes several printed circuit (PC) boards carrying electrical components that make up an operating system. Components on the PC boards may be arranged in groups which make up separate systems, subsystems, circuits, and subcircuits. In order to reduce the physical size of and to simplify the fabrication of such equipment, miniature electrical components of a circuit, for example, may be mounted on a flat, rectangular ceramic or glass substrate to form a hybrid circuit. This method of manufacture is desirable since such hybrid circuits can be tested independently of other elements and circuitry to ensure that the hybrid circuit is operating properly before it is connected into more complex circuitry on a PC board. The electrical circuit patterns on such a hybrid are commonly formed by thick-film or thin-film techniques, with miniature discrete elements being connected thereto and a multipin connector protruding from one edge of the substrate for insertion into plated-through holes on a PC board. Such a hybrid circuit is itself an electrical component that is a complete operational, functional unit. The pins on the hybrid circuit are most commonly inserted into the plated-through holes on a PC board with no external means for supporting it. It is desirable that there be vertical support of the hybrid substrate on the board to prevent damage to the hybrid during manufacture, handling, and servicing of equipment including the PC board. A prior-art technique for supporting hybrids on a PC board utilizes elongated cylindrical rods having a longitudinal slot in one side thereof and a cylindrical groove adjacent one end thereof. Rods are snapped over opposite ends of a substrate, and the one ends of the rods inserted into holes extending through a PC board. These rods have a tendency to fail at the grooves thereon when the circuit board goes through wave-soldering such that they actually provide very little support for the substrate.

An object of this invention is the provision of improved structure for supporting one member on another member.

DESCRIPTION OF DRAWINGS

This invention will be more fully understood from the following detailed description of preferred embodiments thereof, together with the drawings wherein:

FIG. 1 is a side view of a clip or support member 8 embodying this invention and being located above a PC board 10;

FIG. 2 is a front view of the support member 8 in FIG. 1;

FIG. 3 is a side view of a hybrid substrate 12, supported by the member 8 in the PC board 10;

FIG. 4 is a side view of another support member 61 embodying this invention;

FIG. 5 is a front view of the support member 61 in FIG. 4.

DESCRIPTION OF PREFERRED EMBODIMENTS

Referring now to the preferred embodiment of this invention in FIGS. 1-3, a clip or support member 8 is mounted on a PC board 10 for supporting the substrate 12 of a hybrid circuit 13 in a plane substantially orthogonal to the board 10. The substrate 12 is normally a thin, flat, rectangularly shaped plate that is made of ceramic or glass. A plurality of electrical elements 15 (only one being shown in FIG. 3 for simplicity) and circuit patterns are mounted on the substrate. A multipin connector 17 is also attached to the substrate 12 adjacent the bottom one edge 16 thereof. The PC board 10 is conventional and has a plurality of axially aligned plated-through holes 18 therethrough for receiving the connector pins 19 of connector 17. Alternatively, a mating connector socket part (not shown) may be mounted on the PC board 10 and employed instead of the holes 18. The PC board 10 has a hole 21 preferably extending therethrough, which is spaced from the holes 18 and pins 19.

The member 8 comprises an essentially elongated body 26 having a flat bottom surface 23 for contacting an associated flat-top surface 27 of the PC board. A cylindrical peg 22 projects orthogonally from the base 23 adjacent one edge 28 of the body 26. The diameter of peg 22 is such that it makes a slip fit in the hole 21. The length of the peg 22 is preferably greater than the thickness of the PC board, as is shown in FIG. 3.

The other edge 31 of the body 26 is spaced from the peg 22 and is preferably in a plane containing a line B—B that is orthogonal to the base 23. The spacing between the center of peg 22 and the edge 31 is preferably sufficient to make the peg bind in hole 21 when it is located in the latter and the member 26 is rotated counterclockwise in the plane of the paper, as is described more fully hereinafter. A second rectangularly shaped peg 33 extends from the edge 31 with the bottom 35 of this peg 33 being aligned with the base 23. Alternatively, peg 33 may have other shapes such as being cylindrical.

A protrusion on the top of the body 26 has a narrow, transverse slot or trough 40 extending therethrough. The trough 40 opens in the direction of peg 33. The width of the slot 40 is slightly greater than the thickness of the substrate 12 so that the latter will slide smoothly into the slot. The inside wall 41 of the slot 40 is preferably aligned with the edge 31 in a plane containing the line B—B. The spacing between the bottom 43 of slot 40 and the top 36 of peg 33 is slightly greater than the height of the substrate 12. The portion 44 of the side of the body 26 between the edges 31 and 41 is curved away from line B—B to provide clearance from the back side 49 of substrate 12. The thickness $t$ of member 8 is preferably sufficient to cause the peg 22 to bind in hole 21 if the member is rotated into the plane of the paper in FIG. 3. The clip member 8 is preferably made of an electrically nonconductive dielectric plastic material such as an ABS/PCU alloy. The clip 8 may be made by injection molding and has an opening 46 in the center thereof to reduce molding sinks and save material.

In use, the top edge 48 of a substrate 12 is inserted into the slot 40 and the substrate rotated until the back side 49 thereof is pressed against the edge 31 of member 8, the peg 33 being located, for example, between pins 19 on the substrate. Prior to flow-soldering of the PC board, the peg 22 and pins 19 are aligned with associated holes in the board 10 and pressed into these openings. Peg 22 and pins 19 hold the substrate 12 and member 8 in place, even prior to soldering of the pins. The pins 19 in the holes 18 tend to restrict vertical movement of the substrate 12 and clip member 8. If pressure is exerted on the substrate so as to tilt it and the member 8 counterclockwise in the plane of the paper in FIG. 3, the free end 37 of peg 33 contacts the top 27 of board 10 and the circumference of the peg 22 contacts the wall of the hole 21 in the PC board to maintain the substrate 12 and clip member 8 in an upright position. In a similar manner, the peg 22 also preferably binds in the hole 21 if the member 8 is rotated in a plane orthogonal to the plane of the paper in FIG. 3 and including the substrate 12.

The pins 19 in the holes 18 also hold the substrate 12 and member 8 in place as the PC board passes through a flow-soldering operation. After flow soldering, the pins 19 are mechanically and electrically secured in the plated-through holes 18. The hot solder also causes the end 52 of peg 22 to ball over to secure this peg in the opening 21 and hold the member 8 in place. The soldered pins 19 and the balled end 52 of peg 22 keep the hybrid 13 and clip member 8 from being pulled vertically out of the PC board, and from being tipped in the plane of the paper in FIG. 3 or being rotated sideways in a plane containing a broad surface of the hybrid substrate 12, i.e., in such a plane that is orthogonal to the plane of the paper in FIG. 3. The end 37 of peg 33, which is spaced farther from peg 22 than the pins 19, provides additional resistance to counterclockwise rotation of the member 8 and the substrate 12 in the plane of the paper. Also, the circumference of peg 22 binds in hole 21 to prevent sideways rotation of the substrate 12. If pressure is exerted on the substrate 12 to rotate it clockwise in the plane of the paper in FIG. 3, the soldered pins 19 hold the member 8 and substrate 12 against the board. The spacing of the pins 19 from the edge 28 of the body 26 also increases the resistance of the member 8 to clockwise rotation in the plane of the paper. Additionally, the peg 22 binds in the hole 21 to prevent such a rotation of the member 8 and substrate 12.

The alternate embodiment of this invention in FIGS. 4 and 5 is configured to accommodate substrates of different sizes and employs a slightly different arrangement for locking the substrate in a PC board. The support member 61 there has a pair of elongated lower slots 65A and 66A and a pair of elongated upper slots 65B and 66B, at opposite ends of the body 63. The slots 65A and 65B are aligned, as are the slots 66A and 66B. The leading edges 65C and 66C of the upper slots are tapered to facilitate inserting or snapping a substrate into the slots of a support member. Triangular projections 68 and 69 extending from each side of a clip body 63 have flat bases 68A and 69A, which are in a common plane containing the flat base 71 of the body 63. These projections provide additional support for preventing sideways movement of a support member 61 in a PC board. The locking arrangement for holding the support member in a PC board comprises a projection 73 on the base 71 and having an arm 75 extending in a direction away from a plane containing associated elongated slots 65A and 65B. The arm 75 is spaced a distance somewhat greater than the thickness of the PC board from the base 71 to facilitate insertion of the former into an opening in a PC board.

In operation, the bottom edge of a substrate is inserted into a slot 65A for example, and the top edge of the substrate snapped into the associated upper slot 65B. The arm 75 is then inserted into a hole in a PC board and the member 61 rotated until pins on the substrate are aligned with and inserted into associated plated-through holes in the PC board. After such an assembly is passed through a flow-soldering operation, the arm 75 balls up against the bottom of the PC board to hold the clip member 61 and an associated substrate in a substantially upright position, as was described earlier in relation to the support member 8.

Although this invention is described in relation to preferred embodiments thereof, variations and modifications will be apparent to those skilled in the art without departing from the spirit of this invention. By way of example, the pegs 22 and/or 33 may have cross sections that are other than cylindrical and rectangular. Also, the clip 8 may be shaped differently and arranged to orient the substrate 12 at an angle other than 90° with respect to the PC board 10. Further, the connector parts may be on other than the broad sides of the substrate and PC board, and it is not critical which part is associated with the connector pins or sockets. The scope of this invention is therefore to be determined from the attached claims rather than the above detailed description of preferred embodiments of the invention.

What is claimed is:

1. Apparatus for supporting a hybrid substrate (carrying electrical circuit patterns and elements and having a pair of opposing edges) in a given position that is generally orthogonal to a first plane containing a flat member so as to restrict rotational movement of the substrate in a second plane parallel to it and in a third plane orthogonal to the first and second planes after mating connector pin and socket parts associated with the substrate and flat member are engaged, the flat member having a hole in the top side thereof that is spaced from the associated connector socket part, comprising:

a body section having a flat bottom surface for contacting the one side of the flat member and having one side that is adjacent to said bottom surface with at least two spaced-apart sections each having points in the second plane that is generally orthogonal with respect to a fourth plane including said bottom surface;

a protrusion projecting from said side of said body beyond the second plane and being spaced from said bottom surface, said protrusion having a trough therein which is parallel to the second plane with one edge thereof in the second plane, the trough opening generally in the direction of said bottom surface and being dimensioned and positioned for receiving one of the opposing edges of the substrate therein, with one side of the substrate being in the second plane and contacting points of said spaced apart sections and the other one of the opposing edges of the substrate being proximate said bottom surface;

a first peg projecting orthogonally from said bottom surface and having a cross-section that is similar to that of the hole in the flat member and that is dimensioned to provide a slip fit in this hole; and a second peg projecting from said side of said body and beyond the second plane with at least a line in the base of said second peg being in the fourth plane including the bottom surface of said body;

the one and other substrate edges being located in the trough and adjacent the junction of the second peg with the one body side, respectively, and the pin and socket structures being engaged with said first peg located in the hole in the flat member and said bottom surface contacting the one side of the flat member for supporting the substrate orthogonal to the one side of the flat member, said body and first peg each having a thickness causing said first peg to bind in the hole when the body is rotated in the second plane, a point in the free-end of said second peg also being located in the fourth plane and contacting the one side of the flat member for cooperating with said first peg in the hole for increasing the rotational force required for rotating said body in one direction in the third plane.

2. The apparatus according to claim 1 wherein the spacing between the point on said second peg and the first peg, the size of the hole and of the circumference of the first peg, the depth of the hole in the flat member, and the length of the first peg are sufficient to cause said first peg to bind in the associated hole when said body section is rotated in the second plane and in the third plane.

3. Apparatus according to claim 2 wherein the hole extends through the flat member and the free-end of said first peg extends beyond the bottom side of the flat member which is opposite the top side thereof, the body and first peg being made of a material of which the end of peg balls over the bottom side of the flat member proximate the hole therein when this free-end is heated sufficiently.

4. Apparatus according to claim 3 wherein the base line of said second peg is in the same plane as and spaced away from the bottom surface of said body.

5. Apparatus according to claim 3 wherein the base line of said second peg extends through the bottom surface of said body.

* * * * *